United States Patent [19]

Marland

[11] Patent Number: 5,726,606
[45] Date of Patent: Mar. 10, 1998

[54] PRE-EMPHASIS NETWORK WITH VARIABLE TIME DELAY

[75] Inventor: Dale W. Marland, Erieville, N.Y.

[73] Assignee: Eagle Comtronics, Inc., Clay, N.Y.

[21] Appl. No.: 682,375

[22] Filed: Jul. 17, 1996

[51] Int. Cl.[6] ................................................ H03F 3/191
[52] U.S. Cl. ................................................ 330/302; 330/306
[58] Field of Search ............................ 330/284, 302, 330/303, 306, 310, 311; 455/234.1; 348/707

[56] References Cited

U.S. PATENT DOCUMENTS

| | | | |
|---|---|---|---|
| 4,074,311 | 2/1978 | Tanner et al. | 380/7 |
| 4,371,846 | 2/1983 | Gamble | 330/311 X |
| 4,464,636 | 8/1984 | Dobrovolny | 330/306 X |
| 5,124,668 | 6/1992 | Christian | 330/302 |

*Primary Examiner*—Steven Mottola
*Attorney, Agent, or Firm*—Parkhurst & Wendel

[57] ABSTRACT

A pre-emphasis network used in a television signal jamming encoder has a variable gain tuned amplifier first stage and an attenuable notch filter and variable gain broadband amplifier second stage. The notch filter is tuned to a center frequency above the television signal intermediate frequency's visual carrier frequency resulting in 15 dB of increased pre-emphasis and a time delay which compensates for a time delay imparted by a decoding network upon decoding of a signal jammed by this encoder.

18 Claims, 9 Drawing Sheets

PRE-EMPHASIS NETWORK WITH VARIABLE TIME DELAY

FIELD OF INVENTION

This invention relates to signal amplification and processing and in particular to an apparatus and method for television signal pre-emphasis with time delay control.

BACKGROUND OF THE INVENTION

In Tanner et al. U.S. Pat. No. 4,074,311 a television scrambling system is described in which a jamming signal of sufficient magnitude is injected between the visual and aural carriers of a channel in a standard television channel signal. The injected signal prevents reception of the channel unless the channel is first decoded by selectively removing the jamming signal with a notch filter. Tanner et al. also teach signal pre-emphasis centered around the jamming signal frequency to compensate for the high frequency video energy that is inadvertently removed by the decoding notch filter when the jamming signal is removed.

Presently, pre-emphasis is accomplished by a single level pre-emphasis network comprising, for example, a transistor amplifier tuned to a center frequency equal to that of the jamming signal. However, the single level network becomes increasingly inadequate as jamming and decoding frequencies increase. In particular, upon decoding, the visual signal in the vicinity of the center frequency of the decoding notch filter will experience an increased time delay with respect to the remainder of visual carrier, thereby degrading the received picture.

SUMMARY OF THE INVENTION

It is therefore an object of the present invention to provide a pre-emphasis network and method that pre-delay the visual carrier and related sideband energy in conjunction with pre-emphasis to compensate for delays incurred during the decoding process of a channel secured by a jamming signal.

It is a further object of the present invention to provide a variable gain pre-emphasis network and method to compensate for the losses incurred during the decoding process of a channel secured by a jamming signal.

It is yet a further object of the present invention to provide a pre-emphasis network and method wherein the gain and delay can be custom aligned for improved decoded picture results.

According to a first embodiment of the present invention a pre-emphasis network comprises a first variable amplifier, connected to an input terminal, for amplifying, around a first center frequency, an input signal, and for outputting a first amplified signal. A notch filter, including a first attenuation means for attenuating the first amplified signal, has a first end coupled to an output of the first amplifier and a second end connected to ground. The notch filter has a second center frequency higher than the first center frequency of the first amplifier, and imparts a time delay to said first amplified signal. A second amplifier has an input coupled to the output of the first amplifier and the first end of the notch filter and amplifies the first amplified and filtered signal. The second amplifier has a second attenuation means for attenuating an output of the second amplifier. Finally, a control means simultaneously controls the first and second attenuation means, thus controlling the attenuation and time delay of the notch filter and the gain of the second amplifier.

The pre-emphasis network according to the first embodiment provides delay compensation coupled with additional pre-emphasis which greatly enhances television picture sharpness even after a decoding filter removes a jamming signal, some sideband picture in the process, and introduces unwanted delays into the channel's passband.

A second embodiment of the present invention differs from the first embodiment in that transistor amplifiers and PIN diodes are replaced by field effect transistors.

In a third embodiment of the present invention fixed value resistors are used to control the first and second attenuation means.

In a fourth embodiment of the present invention fixed value resistors are employed as the attenuation means.

A fifth embodiment of the present invention differs from the first embodiment in that the pre-emphasis network comprises only the notch filter and second amplifier.

BRIEF DESCRIPTION OF THE DRAWINGS

The advantages and features of the present invention will become more clearly apparent from the following description of an illustrative embodiment of the invention, given as a non-restrictive example only and represented in the accompanying drawings, in which.

DETAILED DESCRIPTION OF THE PREFERRED EMBODIMENT

Figure 1:
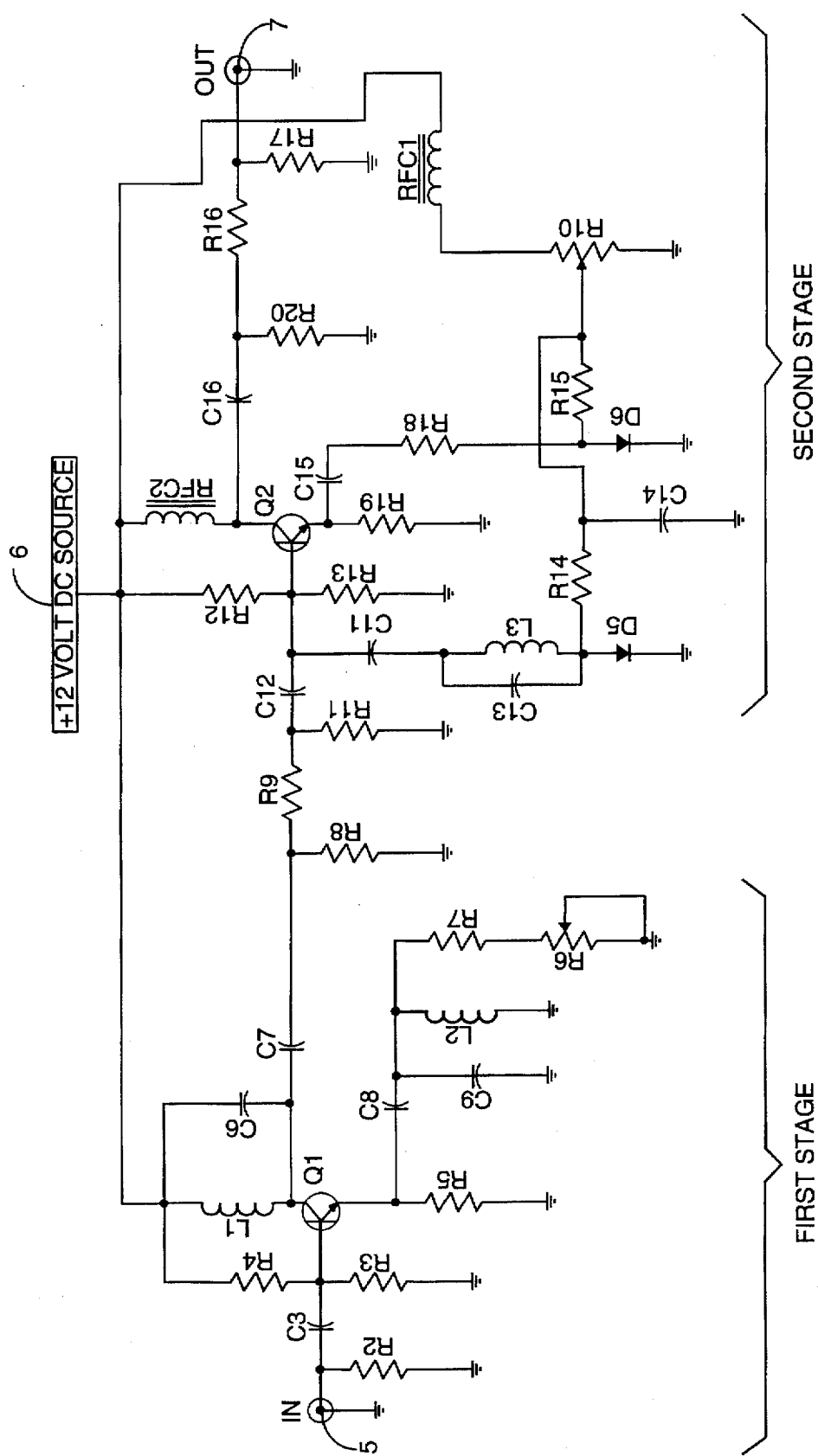
FIG. 1 is a schematic diagram of the pre-emphasis network according to a first embodiment of the present invention.

FIG. 1 shows a schematic diagram of the pre-emphasis network according to a preferred embodiment of the present invention in which there is a first stage and a second stage.

The first stage has an input terminal 5 coupled to the base of transistor Q1 via blocking capacitor C3. A resistor R2, for impedance matching, is connected between the input terminal 5 and ground.

The base of transistor Q1 is biased by the series connection of resistors R3 and R4 connected between a DC voltage source 6 and ground. The collector of Q1 is connected to the DC voltage source 6 via a tank circuit comprising the parallel connection of inductor L1 and capacitor C6. Components L1 and C6 are selected to resonate at a center frequency of the desired pre-emphasis frequency, typically the frequency of a jamming signal to be subsequently added to the overall television signal.

The emitter of Q1 is connected to ground via emitter resistor R5. The emitter of Q1 is also connected to one terminal of capacitor C8. The other terminal of capacitor C8 is connected to the parallel combination of capacitor C9, inductor L2 and the series combination of resistor R7 and potentiometer R6. Opposite terminals of capacitor C9, inductor L2 and potentiometer R6 are connected to ground. Further, the wiper of potentiometer R6 is also connected to ground such that potentiometer R6 operates as a variable resistor.

A first terminal of a blocking capacitor C7 is connected to the collector of Q1 and the second terminal of blocking capacitor C7 functions as the output of the first stage of the pre-emphasis network.

The second terminal of C7, or the output of the first stage, is connected to first terminals of resistors R8 and R9. The second terminal of R8 is grounded. The second terminal of R9 is connected to a first terminal of resistor R11, which has its second terminal grounded, and a first side of blocking capacitor C12 which represents the input to the second stage of the pre-emphasis network. Resistors R8, R9 and R11 form a 75 ohm impedance matching network between the first and second stages of the pre-emphasis network.

The second side of blocking capacitor C12 is connected to a first terminal of capacitor C11. The second terminal of capacitor C11 is connected to a first side of the parallel combination of capacitor C13 and inductor L3. The second side of the parallel combination is connected to the anode of PIN diode D5 which has its cathode grounded. The components C11, C13, and L3 operate as a conventional notch filter. However, PIN diode D5 is controllable to attenuate the response of the notch filter as will be further explained herein.

The second side of blocking capacitor C12 is also connected to the base of transistor Q2. The base of Q2 is biased via the series connection of resistors R12 and R13 connected between the DC voltage source 6 and ground.

The emitter of Q2 is grounded via resistor R19 in parallel with the series combination of capacitor C15, resistor R18 and PIN diode D6. PIN diode D6 is oriented such that its anode is connected to one terminal of resistor R18 and its cathode is grounded. Like PIN diode D5, PIN diode D6 is controllable, thus permitting gain control of the broadband amplifier of the second stage of the pre-emphasis network as will be further explained herein.

The collector of Q2 is connected to the DC voltage source 6 via RF choke RFC2 and to a first side of blocking capacitor C16. The second side of blocking capacitor C16 is connected to first terminals of resistors R16 and R20. The second terminal of R20 is grounded. The second terminal of R16 is connected to output terminal 7 of the pre-emphasis network and to a first side of resistor R17, whose other side is grounded. The resistors R16, R17, and R20 form a 75 ohm impedance matching network between the second stage of the pre-emphasis network and output terminal 7.

Finally, a potentiometer is connected between the DC voltage source and ground via RF choke RFC1. The wiper is AC grounded via capacitor C14 and is coupled to both PIN diodes D5 and D6 through resistors R14 and R15, respectively.

The pre-emphasis network of FIG. 1 operates as follows. With the potentiometer R6 at maximum resistance, the values of the emitter network components, i.e., R5, C8, C9, L2, and R7, are selected to achieve an active amplification curve centered at the jamming signal insertion frequency. For example, 43.5 MHz would be halfway between the visual and aural carriers in an NTSC, System M-N, intermediate frequency bandwidth.

Figure 2:
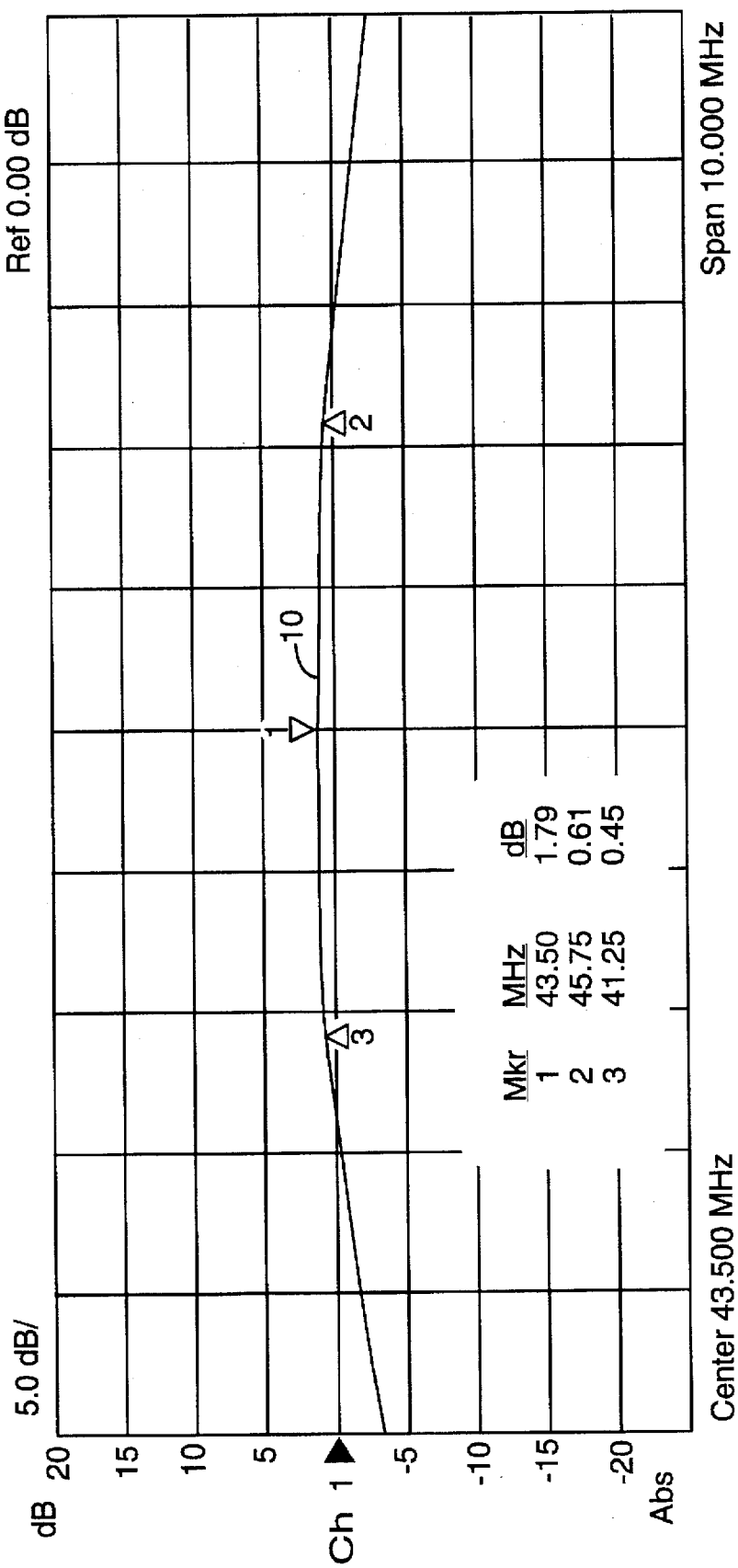
FIG. 2 is a frequency response plot of the first amplifier at minimum gain.
Figure 3:
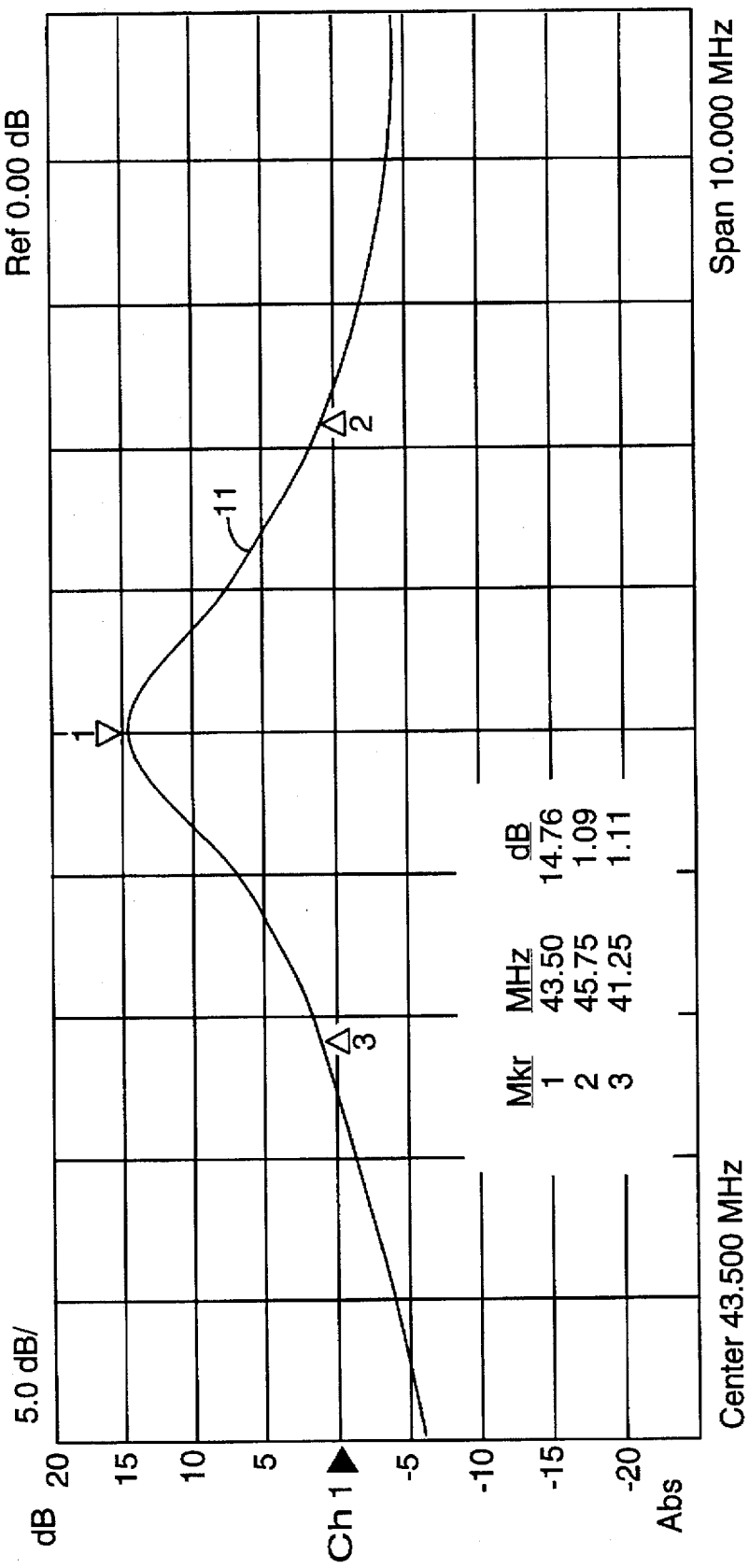
FIG. 3 is a frequency response plot of the first amplifier means at maximum gain.

By adjusting the potentiometer, the tuned emitter network can be dampened without varying the amplifier's frequency. Thus, the potentiometer R6 provides an infinitely variable gain of pre-emphasis of approximately 15 dB. Curve 10 of FIG. 2 shows the response of the first stage of the pre-emphasis network with potentiometer at minimum resistance and curve 11 of FIG. 3 shows the first stage of the pre-emphasis network with potentiometer at maximum resistance.

The second stage of the pre-emphasis network of the present invention has dual purposes. The first purpose is to supply a variable pre-emphasis that may be used in conjunction with the first stage or alone. The second purpose is to supply a variable delay in time to areas of the intermediate frequency passband to help compensate for delays introduced by a decoding filter.

As is known by those skilled in the art, a television signal modulated upon an intermediate frequency carrier begins as a double sideband signal. That is, sideband energy resulting from the signal that is amplitude modulated upon the intermediate frequency carrier extends both positively and negatively in frequency relative to the intermediate frequency carrier. Since the double sideband format wastes a considerable portion of the frequency spectrum, the signal is vestigial sideband filtered to eliminate the energy on one side of the modulated carrier. To restore the information lost during vestigial filtering, a television receiver incorporates a Nyquist filter that places the visual carrier and its close-in sideband energy on a 6 dB slope, thus insuring that any energy from the sidebands sums to an equal level for a flat output.

The second stage of the present invention uses this fact to derive another 15 dB of pre-emphasis by placing a notch filter above the intermediate frequency carrier thereby generating enhanced Nyquist filtering. The notch filter also introduces delay to the sideband energy close in frequency to the visual intermediate frequency carrier, thus compensating for the delay which is introduced by a decoding filter used to descramble the channel.

More specifically, the notch filter comprising capacitors C11, C13 and inductor L3 is tuned to a center frequency approximately 1 MHz above the visual intermediate frequency carrier frequency. The notch filter, therefore, increases the pre-emphasis by decreasing the relative visual carrier amplitude and its close-in sidebands, or enhanced Nyquist filtering.

The amount of additional pre-emphasis and delay obtained due to the notch filter is controlled by varying the potentiometer R10 which biases PIN diode D5. To counteract the increasing loss on the intermediate frequency visual carrier, the potentiometer R10 simultaneously biases PIN diode D6 which varies the gain of an amplifier formed by transistor Q2 and its associated components.

The aforementioned delay compensation coupled with the additional pre-emphasis allows for greatly enhanced picture sharpness after a decoding filter removes the jamming signal, some sideband picture content in the process, and introduces unwanted delays into the channel's passband.

The effect of the pre-emphasis network on a signal is shown graphically in FIGS. 4a–5b in which the horizontal axis represents frequency. At the intermediate frequency of a television channel signal the visual carrier is usually above the audio carrier to permit a frequency inversion to take place when the intermediate frequency is translated to a final radio frequency output. Thus, in FIGS. 4a–5b, marker 3 indicates the aural carrier at 41.25 MHz, marker 1 indicates the center of pre-emphasis at 43.5 MHz, marker 2 indicates the visual carrier at 45.75 MHz, and marker 4 indicates the center frequency of the notch filter at 46.75 MHz. Each of the markers 1–4 are located at the same frequency in each of FIGS. 4a–5b.

Figure 4A:
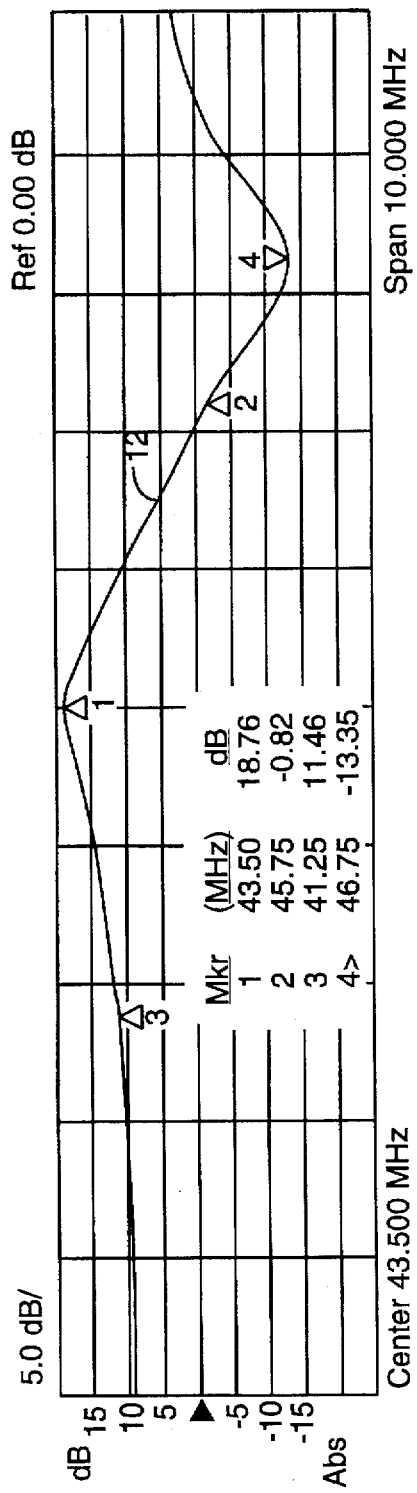
FIG. 4a is a frequency response plot of the entire pre-emphasis network with the first amplifier at minimum gain.
Figure 4B:
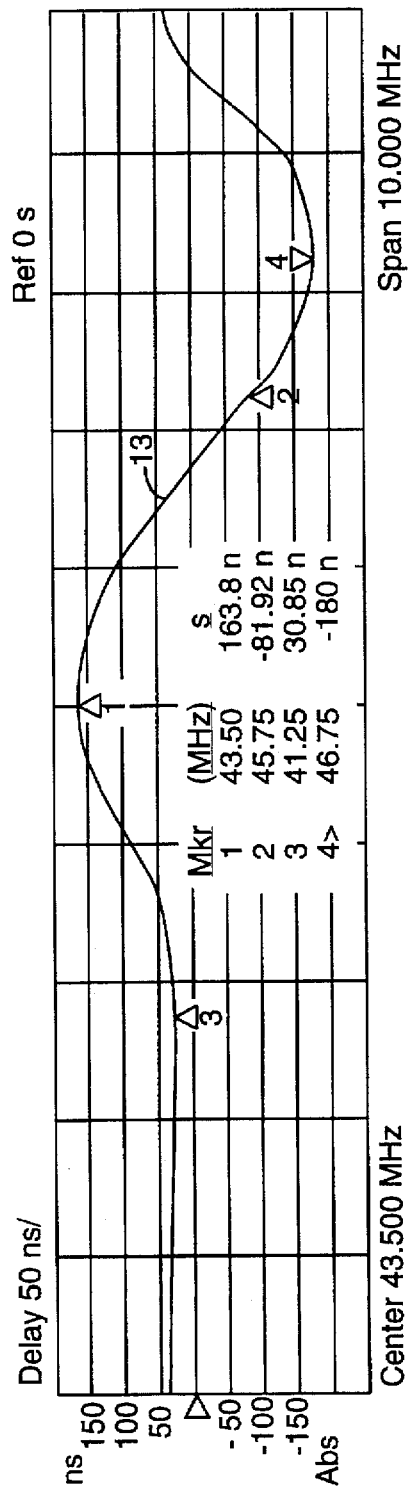
FIG. 4b is a graph of the time delay imparted to a signal passing through the pre-emphasis network with the first amplifier at minimum gain.

Curve 12 of FIG. 4a shows the frequency response of the pre-emphasis network where the first stage is set to minimum gain and the second stage is set at maximum settings, that is, maximum attenuation for the notch filter and maximum gain for the amplifier formed by transistor Q2 and its associated components. The effect of the notch filter on the amplitude of the signal in the vicinity of the visual carrier is readily apparent. Furthermore, with reference to FIG. 4b, curve 13 shows the delay, in nanoseconds, contributed by the notch filter to the signal in the vicinity of the visual carrier. As explained earlier, this delay is desirable in order to compensate for the time delay incurred when decoding. Moreover, since the amount of delay is controllable by varying potentiometer R10 the delay imposed by a decoding notch filter can be accurately compensated.

Figure 5A:
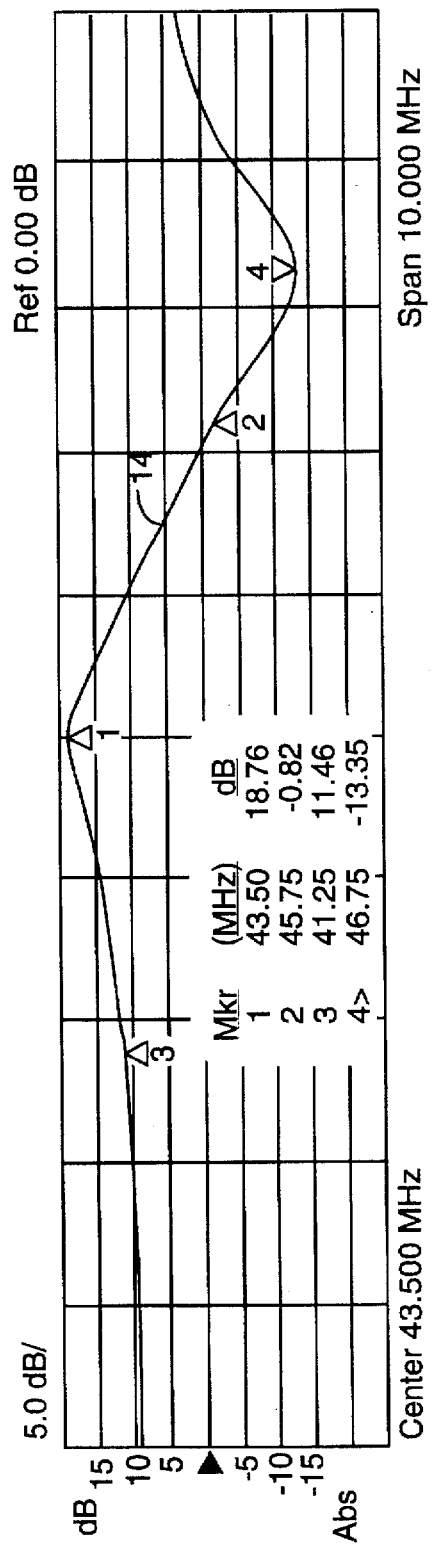
FIG. 5a is a frequency response plot of the entire pre-emphasis network with the first amplifier at maximum gain.
Figure 5B:
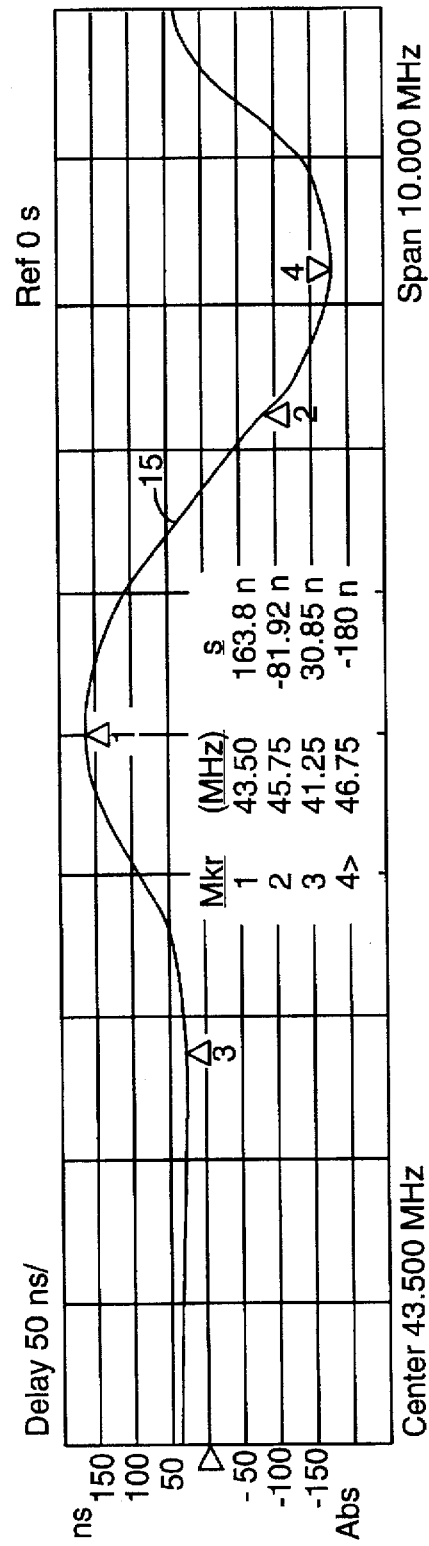
FIG. 5b is a graph of the time delay imparted to a signal passing through the pre-emphasis network with the first amplifier at maximum gain.

Curves 14 and 15 of FIGS. 5a and 5b, respectively, show plots corresponding with curves 12 and 13. In FIGS. 5a and 5b, however, the first stage of the pre-emphasis network is also set to maximum gain. As a result there is in an even greater relative amplitude difference and delay between the visual carrier and the notch center frequency.

Table 1, below, lists typical component values for a pre-emphasis network according to the present invention having pre-emphasis centered around 43.5 MHz.

TABLE 1

| Component Values for 43.5 MHz Center Frequency | |
|---|---|
| C3,C7,C12,C14–16 | .001 µF |
| C6,C13 | 56 pF |
| C8 | 27 pF |
| C9 | 75 pF |
| C11 | 15 pF |
| L1,L2 | 5.5 T |
| L3 | 6.5 T |
| D5,D6 | UM9401 |
| Q1,Q2 | LT1001 |
| R2 | 75 Ω |
| R3–4,R12–13 | 10 KΩ |
| R5,R19 | 100 Ω |
| R6 | 50 KΩ POT |
| R7,R17,R20 | 220 Ω |
| R8,R11 | 430 Ω |
| R9,R18 | 27 Ω |
| R10 | 1KΩ POT |
| R14–15 | 1 KΩ |
| R16 | 56 Ω |
| RFC1 | 8.2 µH |
| RFC2 | 5.5 T |

Figure 6:
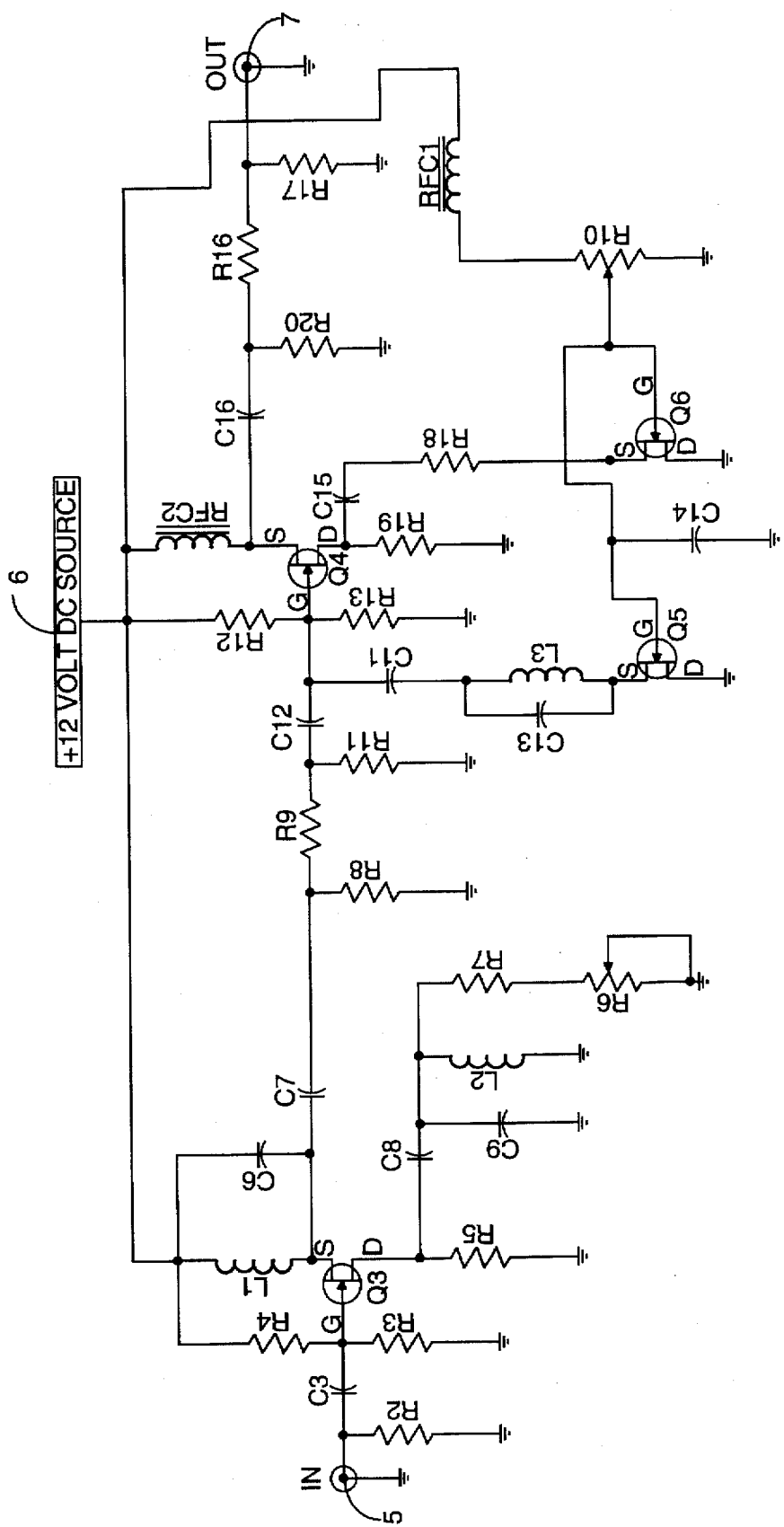
FIG. 6 shows a schematic diagram of the pre-emphasis network according to a second embodiment of the present invention.

A second embodiment of the present invention is shown FIG. 6. In this second embodiment transistors Q1, Q2 and PIN diodes D5, D6 are replaced by field effect transistors Q3, Q4, Q5, Q6, respectively. Operation of the pre-emphasis network according to this second embodiment is the same as in the first embodiment.

Figure 7:
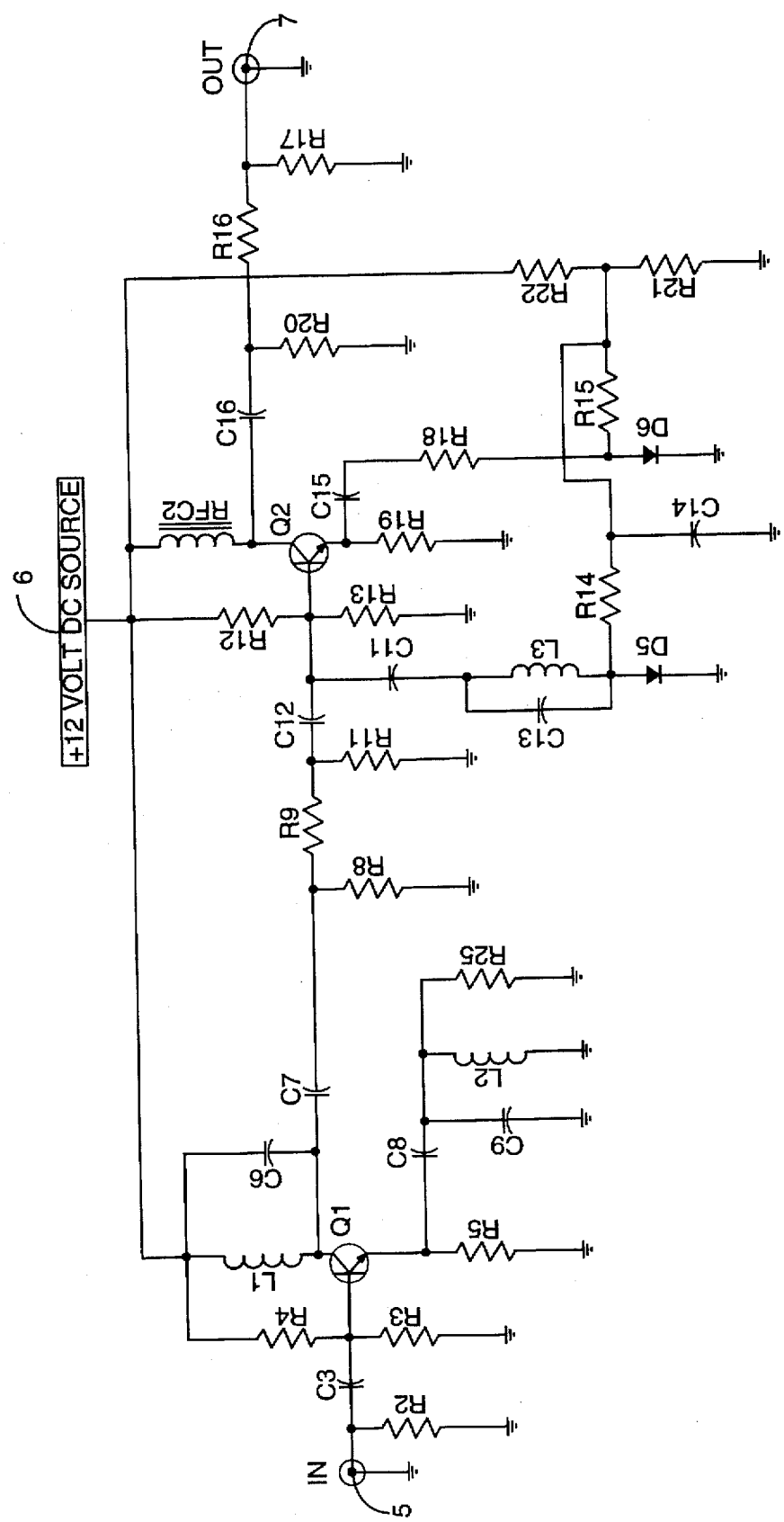
FIG. 7 shows a schematic diagram of the pre-emphasis network according to a third embodiment of the present invention.

FIG. 7 shows a third embodiment of the present invention in which potentiometer R6 and resistor R7 is replaced with fixed value resistor R25 and potentiometer R10 is replaced by fixed value resistors R21 and R22. This results in a less expensive circuit, but one that are not immediately variable.

Figure 8:
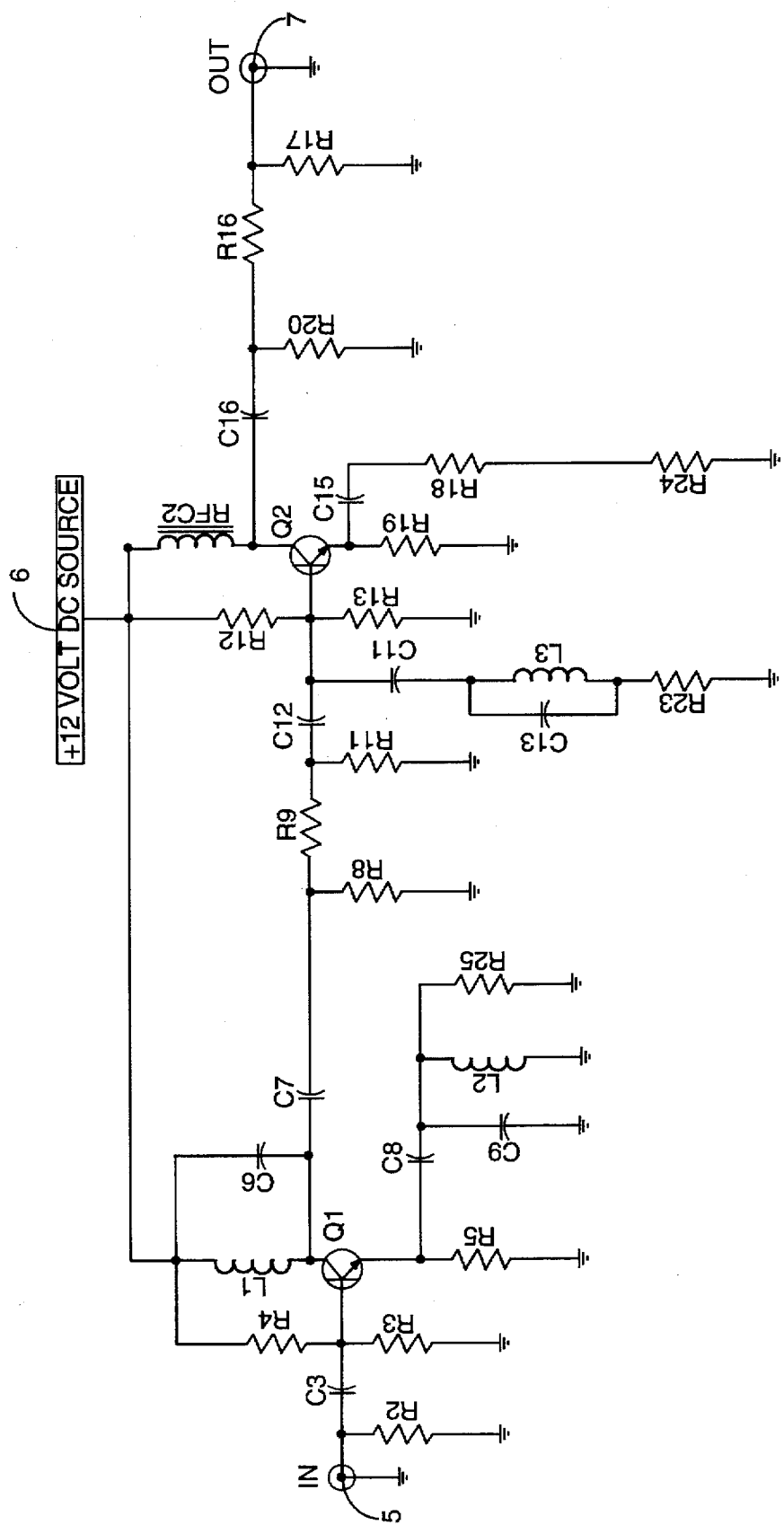
FIG. 8 shows a schematic diagram of the pre-emphasis network according to a fourth embodiment of the present invention.

FIG. 8 shows a fourth embodiment of the present invention. The fourth embodiment differs from the third embodiment in that the PIN diodes D5 and D6 and their associated circuitry are replaced by fixed resistors R23 and R24. The circuit of FIG. 8, therefore, is an even less expensive circuit than that of FIG. 7. However, the circuit of FIG. 8 also cannot be immediately variable.

Figure 9:
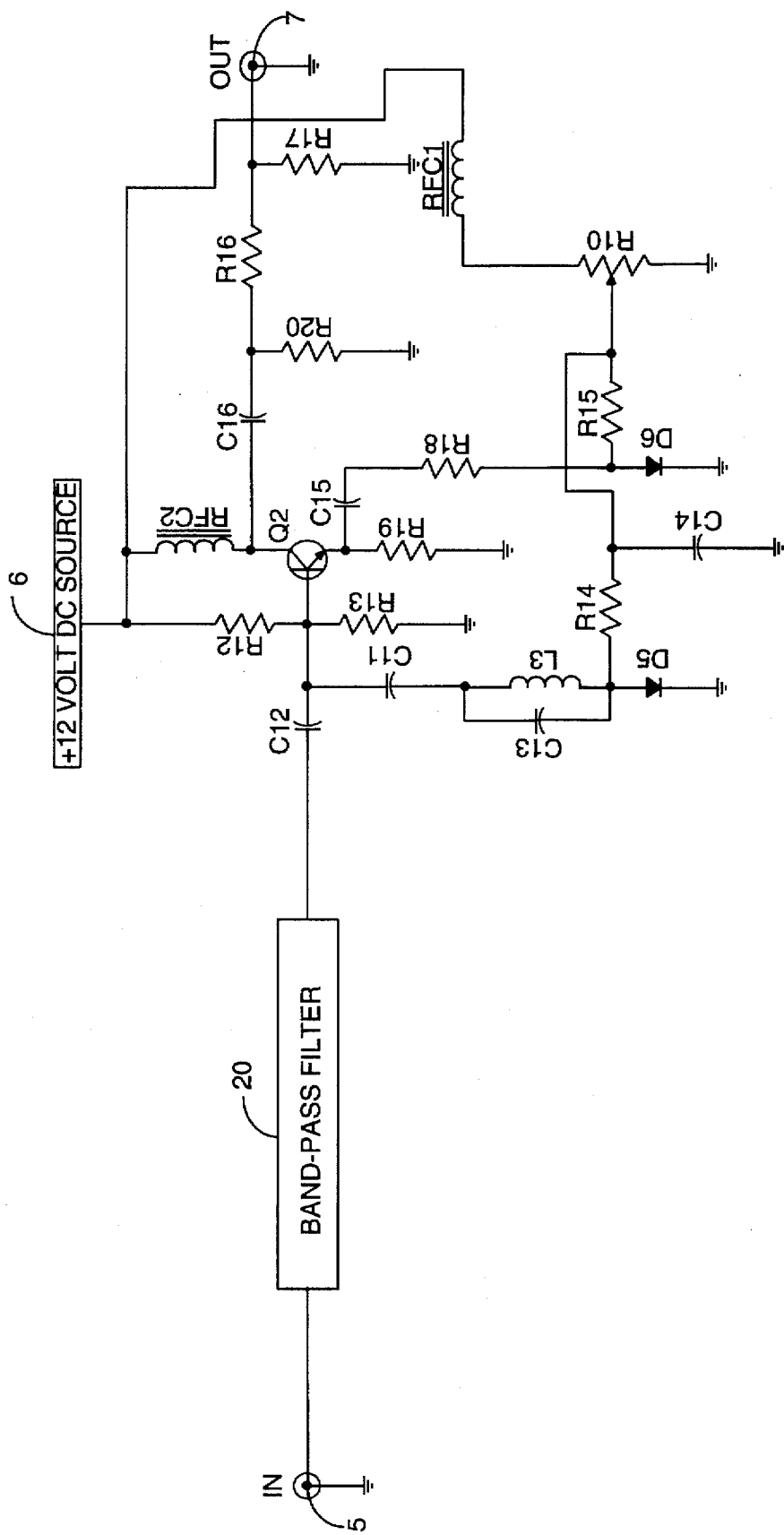
FIG. 9 shows a schematic diagram of the pre-emphasis network according to a fifth embodiment of the present invention.

FIG. 9 shows a fifth embodiment of the present invention in which the first stage tuned amplifier has been deleted. In this embodiment an input signal is processed only by the second stage of the preferred embodiment of FIG. 1. In order for the circuit of FIG. 9 to produce an output similar to that shown in FIGS. 4a–b, for example, an original intermediate frequency television signal would first have to be passed through a band pass filter 20 tuned in such a fashion as to create the desired pre-emphasis on the television signal. This preliminary band-pass filtering is known as negative pre-emphasis.

The invention has been described with reference to certain preferred embodiments thereof. It will be understood, however, that variations and modifications are possible within the scope of the appended claims. For example, the intermediate frequency pre-emphasis frequency and notch filter center frequency could be modified so that the present invention would be operable with different television broadcast standards.

What is claimed is:

1. An electronic circuit, comprising:
   an input terminal;
   a first amplifier, connected to said input terminal, for amplifying an input signal around a first center frequency, and for outputting a first amplified signal;
   a notch filter, including a first variable attenuating means, for attenuating and imparting a time delay to said first amplified signal, having a first end coupled to an output of said first amplifier and a second end connected to ground, said notch filter having a second center frequency higher than said first center frequency of said first amplifier;
   a second amplifier for amplifying the attenuated and time-delayed first amplified signal, said second amplifier having an input coupled to the output of said first amplifier means and the first end of said notch filter, and having a second variable attenuating means for attenuating the output of said second amplifier;
   an output terminal coupled to an output of said second amplifier; and
   control means for controlling said first and second attenuating means.

2. The circuit as claimed in claim 1 wherein said control means controls said first and second variable attenuating means simultaneously.

3. The circuit as claimed in claim 1 wherein one of said first and second variable attenuating means comprises a PIN diode.

4. The circuit as claimed in claim 1 wherein said control means comprises a potentiometer coupled to at least one of said first and second variable attenuating means.

5. The circuit as claimed in claim 1 wherein a gain of said first amplifier is variable.

6. The circuit as claimed in claim 5 wherein said first amplifier is variable within a range from about 0 dB to 15 dB.

7. The circuit as claimed in claim 1 wherein said input signal comprises a television signal.

8. The circuit as claimed in claim 1 wherein at least one of said first and second amplifiers comprises a bipolar transistor.

9. The circuit as claimed in claim 1 further comprising an impedance matching network connected between said first and second amplifiers.

10. The circuit as claimed in claim 1 further comprising an impedance matching network connected between said second amplifier and said output terminal.

11. The circuit as claimed in claim 1 wherein one of said first and second attenuating means comprises a field effect transistor.

12. The circuit as claimed in claim 1 wherein at least one of said first and second amplifiers comprises a field effect transistor.

13. The circuit as claimed in claim 1 wherein said control means comprises a constant value resistance.

14. The circuit as claimed in claim 1 wherein one of said first and second attenuating means comprises a constant value resistance.

15. An electronic circuit, comprising:

a input terminal for receiving an input signal;

a notch filter, including a first attenuating means for attenuating said input signal, having a first end coupled to said input terminal and a second end connected to ground, said notch filter having a predetermined center frequency, and imparting a time delay to said signal;

an amplifier for amplifying the attenuated and time-delayed input signal, said amplifier having an input coupled to said input terminal and the first end of said notch filter, and having a second attenuation means for attenuating the output of said amplifier;

an output terminal coupled to an output of said amplifier; and control means for controlling said first and second attenuation means.

16. The circuit as claimed in claim 15 wherein said input signal comprises a television signal.

17. A method of processing an electronic signal, comprising:

amplifying an input signal around a first center frequency resulting in a first amplified signal;

filtering said first amplified signal through a notch filter having a variable attenuating means such that an attenuation and a time delay are selectably imparted to a portion of said first amplified signal;

amplifying the attenuated and time-delayed first amplified signal through a variable gain amplifier; and controlling the attenuation and time delay in said filtering step and said gain of said variable gain amplifier in said amplifying step.

18. A method of processing an electronic signal, comprising:

processing an intermediate frequency signal for a cable television television channel through a bandpass filter having a first center frequency;

filtering said processed signal through a notch filter having a second center frequency higher than the first center frequency of said bandpass filter thereby imparting a time delay to a portion of said processed signal; and amplifying the processed and filtered signal.

* * * * *